United States Patent [19]

Sprouse et al.

[11] Patent Number: 5,951,703
[45] Date of Patent: Sep. 14, 1999

[54] SYSTEM AND METHOD FOR PERFORMING IMPROVED PSEUDO-RANDOM TESTING OF SYSTEMS HAVING MULTI DRIVER BUSES

[75] Inventors: Jeffrey A. Sprouse, Mountain View; Walter E. Gibson, San Jose, both of Calif.

[73] Assignee: Tandem Computers Incorporated, Cupertino, Calif.

[21] Appl. No.: 08/083,419

[22] Filed: Jun. 28, 1993

[51] Int. Cl.$^6$ .................................................. G01R 31/28
[52] U.S. Cl. .......................................... 714/730; 714/734
[58] Field of Search .................................. 371/22.1, 22.2, 371/22.3, 22.4, 22.5, 22.6, 25.1, 27, 18; 324/73.1, 158 R; 714/724, 725, 726, 727, 728, 729, 730, 731, 732, 733, 734, 736, 738, 739, 740, 741, 742, 743, 744

[56] References Cited

U.S. PATENT DOCUMENTS

| | | | |
|---|---|---|---|
| 3,783,254 | 1/1974 | Eichelberger | 235/152 |
| 4,049,956 | 9/1977 | Van Veen | 235/153 |
| 4,216,539 | 8/1980 | Raymond et al. | 371/20 |
| 4,326,290 | 4/1982 | Davis et al. | 371/21 |
| 4,513,418 | 4/1985 | Bardell, Jr. et al. | 371/25 |
| 4,517,672 | 5/1985 | Pfleiderer et al. | 371/22.2 X |
| 4,534,028 | 8/1985 | Trischler | 371/25 |
| 4,575,674 | 3/1986 | Bass et al. | 324/73 |
| 4,594,711 | 6/1986 | Thatte | 371/22.3 |
| 4,602,210 | 7/1986 | Fasang et al. | 324/73 |
| 4,604,746 | 8/1986 | Blum | 371/22.3 |
| 4,688,222 | 8/1987 | Blum | 371/22.4 |
| 4,701,921 | 10/1987 | Powell et al. | 371/22.3 |
| 4,718,065 | 1/1988 | Boyle et al. | 371/25 |
| 4,791,358 | 12/1988 | Sauerwald et al. | 371/22.3 X |
| 4,801,870 | 1/1989 | Eichelberger et al. | 371/25.1 X |
| 4,811,344 | 3/1989 | Chauvel et al. | 371/22.1 |
| 4,817,093 | 3/1989 | Jacobs et al. | 371/25 |
| 4,827,476 | 5/1989 | Garcia | 371/25 |
| 4,860,290 | 8/1989 | Daniels et al. | 371/25 |

(List continued on next page.)

OTHER PUBLICATIONS

Copy of European Search Report.
European Patent Application No. 93304594.0, Publication No. 0 578 386 A3.
European Patent Application No. 93304594.0, Publication No. 0 578 386 A2.
European Patent Application No.90308724.5, Publication No. 0417 905 A2.
Japanese Patent Appln. No. 58–63272, Semiconductor Testing Circuit, vol. 9, No. 50 (P–339) Mar. 5, 1985.
"Embedded Array Test With Ecipt" IBM Technical Disclosure Bulletin vol. 28, No. 6, Nov., 1985, pp. 2376–2378.
"A Survey of Design for Testability Scan Techniques" E.J. McCluskey, Semicustom Design Guide, Summer 1986, pp. 110–119.

Primary Examiner—Eric B. Stamber
Attorney, Agent, or Firm—Townsend and Townsend and Crew LLP

[57] ABSTRACT

A digital system includes a number of digital subsystems interconnected by a shared bus structure that is mutually exclusively accessible for communicating data between the subsystems. The system is structured to be tested by pseudo-random scan test methodology. Each subsystem includes a counter that, during scan test periods, provides an enable signal to the bus access or driver circuitry of the associated subsystem. A scan test operation is preceded by pre-loading each counter with a predetermined state so that, initially, and throughout the test period, one and only one digital subsystem will drive the shared data bus. Each scan test sequence (comprising a scan in, an execution cycle, and a scan out of the pseudo-random test strings) will result in the counters being clocked once so that a new subsystem will be enable to drive the bus the next sequence, permitting the bus access circuitry of each subsystem, and the bus itself, to be tested.

20 Claims, 3 Drawing Sheets

U.S. PATENT DOCUMENTS

| | | | |
|---|---|---|---|
| 4,875,003 | 10/1989 | Burke | 324/73 |
| 4,989,208 | 1/1991 | Akao et al. | 371/18 |
| 5,012,180 | 4/1991 | Dalrymple et al. | 371/22.1 X |
| 5,012,185 | 4/1991 | Ohfuji | 324/158 |
| 5,032,783 | 7/1991 | Hwang et al. | 324/73.1 |
| 5,051,997 | 9/1991 | Sakashita et al. | 371/22.4 |
| 5,132,635 | 7/1992 | Kennedy | 371/22.3 X |
| 5,134,638 | 7/1992 | Stephens et al. | 371/22.1 X |
| 5,161,160 | 11/1992 | Yaguchi et al. | 371/22.5 X |
| 5,173,904 | 12/1992 | Daniels et al. | 371/22.3 |
| 5,185,745 | 2/1993 | Manca, Jr. | 371/22.1 X |
| 5,210,757 | 5/1993 | Barlow et al. | 371/18 X |
| 5,293,123 | 3/1994 | Jordan et al. | 371/22.1 X |
| 5,331,643 | 7/1994 | Smith | 371/22.3 |

SYSTEM AND METHOD FOR PERFORMING IMPROVED PSEUDO-RANDOM TESTING OF SYSTEMS HAVING MULTI DRIVER BUSES

BACKGROUND OF THE INVENTION

The present invention is directed generally to testing digital apparatus such as is found in data processing systems. The invention relates more particularly to test techniques in which sequences of pseudo-random test patterns are shifted ("scanned") into and out of digital apparatus, producing resultant signatures from which can be determined whether or not the apparatus under test will function without fault. In particular, the invention provides a method, and apparatus implementing that method, for functionally scan testing a digital system of the type including a bus structure that is accessible by individual units on a mutually exclusive basis.

The advent of large scale and very large scale integration (LSI and VLSI) produced a variety of techniques for testing the very large amounts of digital circuitry that can found in integrated circuits (ICs) and combinations of ICs (e.g., as may be found on printed circuit or other types of boards and systems). One such technique involves application of a variety of known test signals to the IC or combination of ICs (hereinafter "digital system") and observing the output signals produced in response to determine if what was expected was produced by the digital system. An offshoot of this approach, and one that is becoming increasingly popular, involves designing the elemental memory stages of the system (i.e., single bit storage such as flip flops, latches, and the like) to be capable of functioning in one of two modes: a first or "run" mode in which the memory stage operates in its capacity for which it was incorporated in the digital system (e.g., a component of the system, operating to receive, store, and pass on system information bits in response to normal logic system control signals); and a second or "scan" mode in which a number of the memory stages are intercoupled in series to form one or more extended shift registers or, as more commonly referred to in the art, "scan strings" or "scan chains."

One method of using these scan strings involves forming known test patterns ("vectors") that are put in place in the digital system by shifting ("scanning") them into the system using the scan chains. The system is then allowed to run for a period of time (e.g., one or more clock periods), and the state of the system (i.e., the content of each memory stage) removed for observation, again using the scan chains.

There are a number of variations on this approach, one of which involves using the scan chains to place the digital system in a pseudo-random state to test the operability of the system. According to this approach, the system is switched from the first or run mode to the scan mode for receiving pseudo-random bit patterns that are scanned into the scan strings to place the system in a pseudo-random state. The technique may include the step of returning the system momentarily to its run mode configuration, and permitting it to operate for one clock cycle. The system is then returned to the scan mode, the digital state (i.e., the content of the scan string or strings) extracted (again by scanning), and that state then analyzed to determine the operability of the stages and interconnections of the system, and thereby the system itself.

Preferably, the steps of configuring the system to form the scan chains, scanning in the pseudo-random data, reinstating the normal configuration for an execution cycle, and returning the system to a scan configuration to remove (scan out) the resultant (pseudo-random) state is repeatedly performed with the extracted state compressed (such as through a cyclic redundancy) to form a "signature" that can be compared to a known, defect-free signature. If the signatures match, the test is considered to have been passed. This testing technique is usually referred to as "pseudo-random scan testing."

Among the underlying principles of pseudo-random scan test methods is that the test must be repeatable or "deterministic" in the sense that each time a digital system is tested, the results of that test will be the same if the system is without fault. Examples of such pseudo-random test methods and apparatus may be found in U.S. Pat. Nos. 4,718,065, 4,534,028, and 4,827,476.

Pseudo-random scan testing can provide many benefits. It is a cost effective test method that can be performed without the need to form special test vectors in advance; it can be performed very fast to check or verify the operability of very large amounts of digital circuitry; and it can be performed using test circuitry less expensive and less complex than other test techniques. However, pseudo-random testing is not without certain problems.

One such problem is the obvious difficulty, if not inability, to predict in advance the state that the test signals will take on during the test period. Circuitry contained in the digital system that may produce different results (e.g., random access memory units, inputs from external sources, etc.) from test to test must either be excluded from testing or somehow designed so that, during pseudo-random testing, it will produce deterministic results.

This problem has been particularly troublesome in digital systems incorporating a bus structure that is shared (e.g., a three-state bus structure) on a mutually exclusive basis by two or more digital subsystems to communicate data therebetween. When such a system is subjected to pseudo-random testing, there exists the possibility that, at any moment in time, two or more of the subsystems will be attempting to drive data onto the data bus at the same time. The moment may see the bus assuming one state in one test (or portion of test), and assuming another state in another test. Since it is not entirely certain what state the bus will assume from test to test, the test can no longer be termed deterministic. Perhaps more importantly, the bus may be damaged by being driven by two or more of the subsystems at the same time.

A flip side to the forgoing problem involves the situation of none of the subsystems driving the shared bus, allowing it to float. In this case the bus can assume a non-deterministic value, which one or more of the subsystems will attempt to read so that, again from test to test, different test results can be produced.

One approach to solving this problem has been to include in the system a bus arbiter that receives requests for access to the bus. Using decoder circuitry, the arbiter issues a mutually exclusive bus enable signal to one and only one requester. This approach permits pseudo-random testing since the arbiter circuitry cannot permit more than one subsystem to drive the bus at any one moment in time. However, the approach tends to limit normal operating performance due to the extra time it takes to perform the arbitration. Thus, digital systems with such shared bus configurations have usually taken the approach of locking out the circuitry that drives the bus during pseudo-random testing, and the bus itself. This has resulted in the system not being completely tested—if tested at all.

Accordingly, there is a need for including in pseudo-random scan testing techniques a methodology and apparatus that can permit the test to include the shared bus and the circuitry used to access that bus.

SUMMARY OF THE INVENTION

The present invention is directed to a digital system that includes a number of digital subsystems interconnected by a shared bus structure that is mutually exclusively accessible for communicating data between the digital subsystems. The present invention permits the bus access circuitry of each subsystem, and the bus itself, to be tested by pseudo-random scan testing methodology without restricting bus access to only one subsystem, and distributing that access during the test to all subsystems.

According to a preferred embodiment of the present invention, each digital subsystem is provided with a counter that, during scan test periods, provides an enable signal to the bus access or driver circuitry of each subsystem. When a scan test operation is initiated, each counter is pre-loaded with a predetermined state so that, initially, and throughout the test period, one and only one digital subsystem will drive the shared data bus. Each scan sequence (each sequence being a scan in, an execution cycle, and a scan out of the pseudo-random test strings) will result in the counters being clocked once so that a new subsystem will be enable to drive the bus the next sequence.

In this preferred embodiment of the invention each of the counters is a ring counter in which a single bit is circulated to provide the enable signal. In addition, as with most synchronous machines, the enable signal to which the bus drive circuitry is responsive is developed from a pipelined organization that includes a latch or register to hold the enable signal. This latch or register forms, during the scan test period, the last stage of the ring counter.

A number of advantages are achieved from the present invention. First and perhaps most importantly, the present invention provides a technique that enables inclusion in pseudo-random scan testing of a digital system the circuitry used by subsystems of that system for accessing a shared bus while still maintaining a test with deterministic results. In addition, pseudo-random scan testing may be performed without fear of damage to the shared bus.

These and other advantages and features of the present invention will become apparent to those skilled in this art upon a reading of the following detailed description of the invention, which should be taken in conjunction with the accompanying drawings.

DETAILED DESCRIPTION OF THE INVENTION

Figure 1:
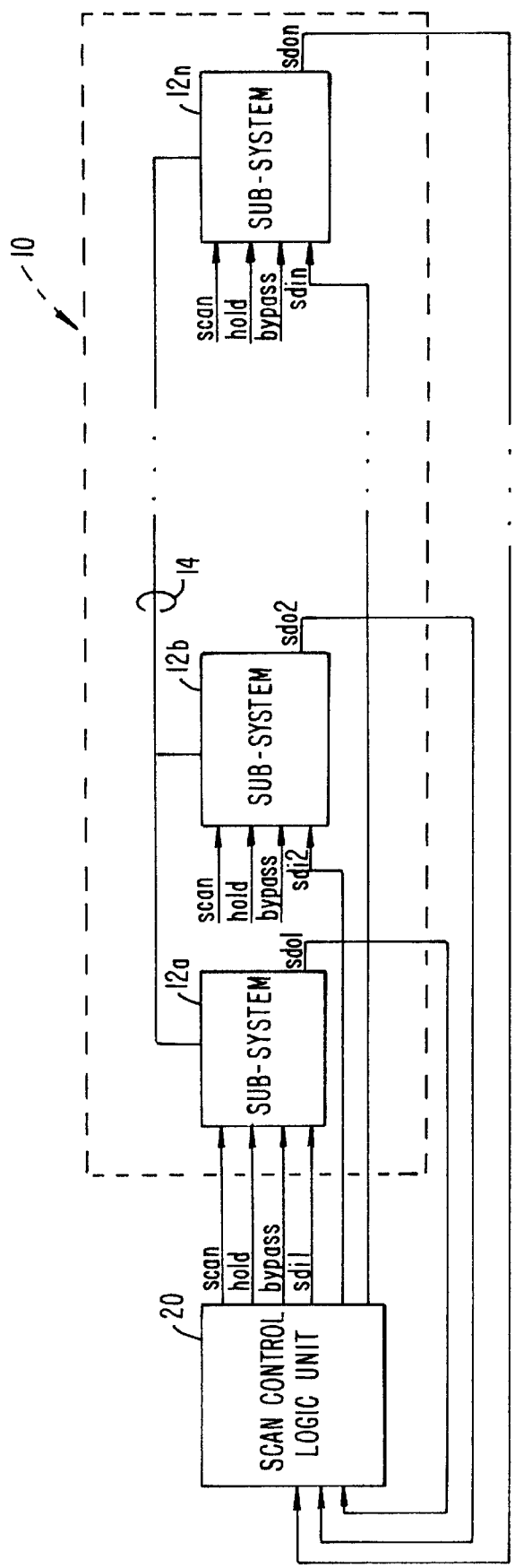
FIG. 1 is a block diagram representation of a digital system formed from a number of digital subsystems interconnected by a shared data bus, and also showing the scan control logic associated with the digital system for performing pseudo-random testing on the system.

Referring now for the moment to FIG. 1, there is illustrated a digital system 10 that comprises individual digital subsystems 12 (12a, 12b, . . . , 12n). Subsystems 12 are interconnected by a shared bus 14 for communicating data and/or address signals thereon for inter-subsystem communication. The subsystems 12 could, for example, be one or more processor units, input/output (I/O) channel(s), memory system(s), and the like, with each of the subsystems capable of accessing the shared data bus 14 according to a predetermined protocol. That protocol is not important to the present invention, other than noting that the shared data bus 14 is accessible on a mutually exclusive basis; that is, only one of the subsystems 12 at any moment in time will be driving the shared data bus 14 with data, command, and/or address signals. Preferably, the arbitration of access to the shared bus 14, in the event two or more of the subsystems 12 desire access to the bus at substantially the same time, is distributed in the sense that each subsystem arbitrates access to the bus on its own—according to a predetermined priority.

As FIG. 1 also illustrates, a scan control logic unit 20 of generally conventional design that includes a 17 stage linear feedback shift register (LFSR—not shown) capable of developing $2^{17}-1$ states before repeating. The scan control logic 20 will operate to develop the necessary test signals (scan, hold, bypass) used to perform scan testing of the subsystems 12—including, of course, the pseudo-random patterns that are applied to the subsystems 12 via scan data in paths ($sdi_1$, $sdi_2$, . . . , $sdi_n$) respectively coupling the scan control logic to the subsystems 12.

Digressing for a moment, it will be appreciated by those skilled in this art that the subsystems 12 will be constructed in accordance with conventional scan test techniques; that is, the elemental memory stages (i.e., the single bit storage elements (not shown) used for flip flops, latches, and the like) used in the subsystems 12 will be designed to be selectively placed in one of two modes of operation in response the to the scan test signals supplied by the scan control logic 20: normal mode, or scan mode. When in scan mode elemental memory stage is interconnected with its brethren in the subsystem 12 to form one long shift register (or a number of smaller shift registers). While the configurations of such elemental memory stages are various and well known, it is believed that the present invention will be better appreciated and understood if the preferred construction of such elemental memory stages is considered.

Figure 2:
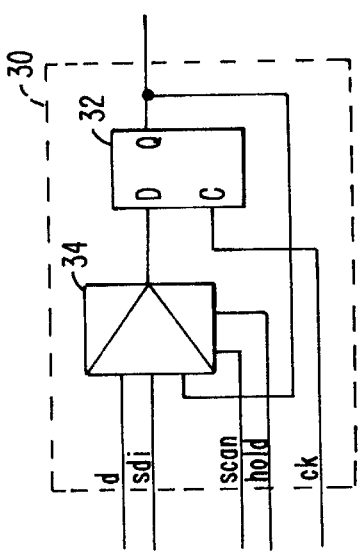
FIG. 2 is a diagrammatic representation of the structure of the elemental memory stages used in each of the subsystems shown in FIG. 1 to implement pseudo-random scan testing.

Thus, referring to FIG. 2, there is illustrated an elemental memory stage as used in the subsystems 12, designated generally with the reference numeral 30. As FIG. 2 shows, the memory stage 30 comprises a basic storage element 32 that receives, at its data (D) input, the output of a multiplexer 34. The output (Q) of the storage element 32 forms the output of the memory stage 30. The storage element 32 receives, at its clock (CK) input, a clock (CLK) signal that is instrumental in storing the data then applied to its data input (D) in conventional fashion.

The multiplexer is constructed to receive data signals at its data (d) and scan data (sdi) inputs. The third input of the multiplexer 34 receives the output of the storage element 32. The selection between which of the inputs to the multiplexer 34 is communicated to the data input (D) of the storage element 32 is determined by the scan the signals applied to the scan and hold inputs, according to Table I, below.

TABLE I

| SCAN | HOLD | DATA OUT |
|---|---|---|
| 0 | 0 | DATA IN (d) |
| 1 | 0 | SCAN DATA IN (sdi) |
| 1 | 1 | Q |
| 0 | 1 | Q |

As Table I shows, when neither of the signals applied to the scan and hold inputs are asserted the storage element 32 receives the signal received at the data input, d, of the stage 30. Conversely, when the signal applied to the scan input is asserted, the data (D) input of the storage element 32 will receive whatever is applied to the scan data (sdi) input of the stage 30. Finally, if the signal applied to the hold input is asserted, irrespective of the state of whatever is applied to the scan input, the data of the stage 30 is recirculated by returning to the data (D) input of the storage element 32 its output Q each period of CLK. Thus, when the hold signal is asserted, the stage 20 holds the stored value until released from its held state. In the environment of the sub-systems 12, stage 30, whether in normal operating mode or scan test mode, the clock (CLK) signal is the system clock used for synchronous operation of the elements of the subsystem.

From the viewpoint of the subsystems 12, when the scan control logic 20 asserts the scan signal to initiate the scan test mode, the elemental memory stages 30 of each subsystem are reconfigured from their normal functioning state to one that permits formation of the extended shift registers or scan strings that receive the initialization and pseudo-random data for the test. Pseudo-random data produced by the scan control logic is shifted into the scan strings of formed in each of the subsystems 12 via the scan data in lines $sdi_1, \ldots, sdi_n$, and scanned out via the scan data out lines $sdo_1, \ldots, sdo_n$.

Returning to FIG. 1, as indicated above, the particular protocol to provide access to the shared bus 14 is not important to the present invention. What is important is to understand that, during normal operation, one and only one of the subsystems 12 is granted access, and allowed to drive, shared bus 14 for communicating data thereon to one or more of the other subsystems 12. Since, when the subsystems 12 are placed in pseudo-random states, this requirement for sharing the shared data bus 14 must be maintained, the present invention is provided, and illustrated in FIG. 3.

Figure 3:
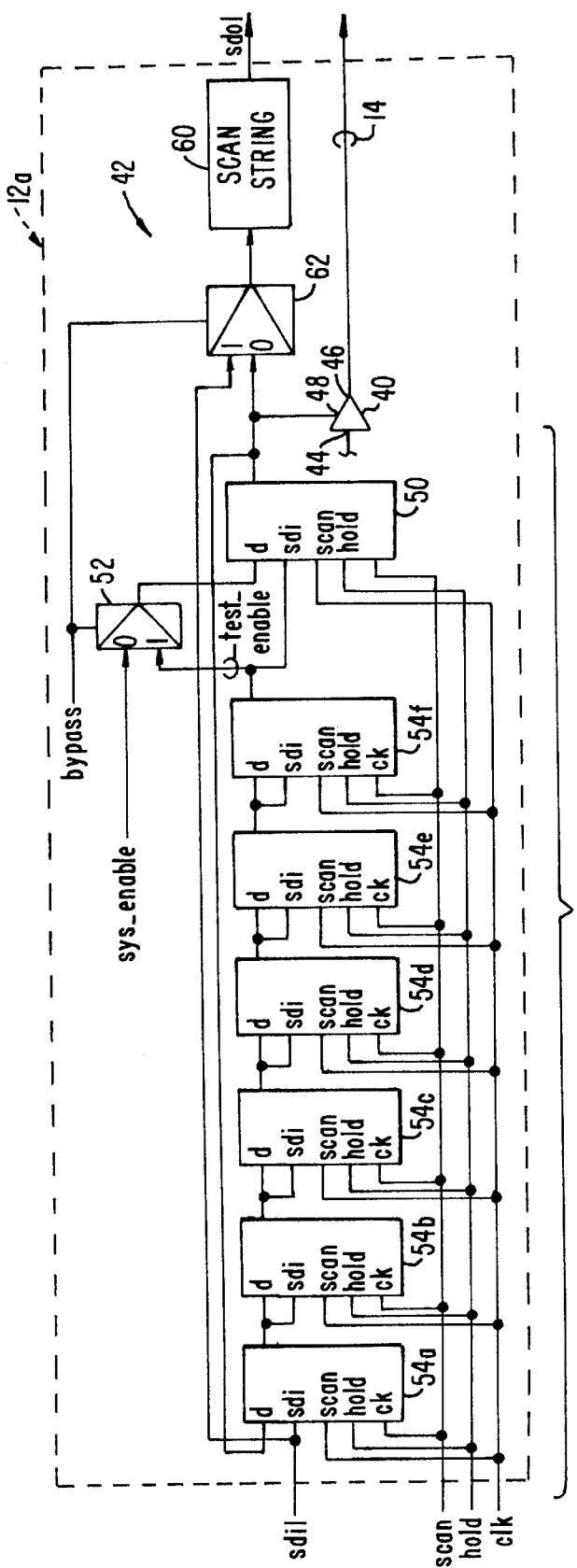
FIG. 3 is a schematic representation of the counter used in association with the drive enable circuitry for one of the subsystems of FIG. 1, during scan test periods, to ensure that one and only one subsystem will drive the shared data bus during scan test.

Turning now to FIG. 3, there is illustrated the bus driver circuit, designated generally with the reference numeral 40 for the subsystem 12a, together with the scan logic 42 that will control the bus driver circuit 40 of the subsystem 12a during scan tests. The remaining subsystems 12b, ..., 12n (FIG. 1) will include substantially identical circuitry so that the discussion of the enable circuit 40 and associated scan logic 42 of subsystem 12a should be taken to apply equally the circuitry of subsystems 12b, ..., 12n, unless noted otherwise.

As FIG. 3 illustrates, the scan logic 42 for the bus driver circuit 40 includes a bus enable register 50, multiplexer 52, a string of registers 54a, ..., 54f, and a multiplexer 62. When placed in a scan mode by the control logic 20, the registers 54a, ..., 54f and bus enable register 50 form a seven-stage ring counter 54.

The bus driver circuit 40, which preferably is a tri-state device (i.e., the output of which is capable of assuming one of the three states of a logic HIGH, a logic LOW, or a high impedance state), receives at its input 44 data from logic (not shown) of the subsystem 12a for communication on the shared bus 14. That received data will be communicated to the shared bus 14, via its output 46, when the signal applied to the enable input 48 is asserted.

During normal operation, the signal for enabling the driver circuitry 40 is supplied by the bus enable register 50 which, in turn, receives (at its data (d) input) the system enable (sys_enable) from the multiplexer 52. During scan mode, the signal for enabling the bus driver circuit 40 is supplied by the output of stage 54f, and received by the bus enable register at its scan data in (sdi) input.

The stages 54a, ..., 54f and the bus enable register 50, receive at their respective hold inputs a hold signal that is developed according to the following relationship:

$$hold' = hold + (scan \cdot bypass).$$

Hold, scan, and bypass are the test signals asserted by the scan control logic 20 during scan mode of operation. (The bypass test signal is also used to wall off non-scannable circuitry—not shown—during the scan process.) Thus, the stages of the counter 54 will be placed in hold state when the scan control logic 20 asserts (1) the hold signal, or (2) both the bypass and scan signals.

The clock (CK) inputs of stages 54a, ..., 54f and drive enable register receive the system clock (CLK) signal used by the subsystem 12a for synchronous operation. The CLK signal is used for both normal and scan test operation. It will be appreciated that the individual stages 54a, ..., 54f of the ring counter 54, as well as the bus enable register 50 are constructed as described above with reference to FIG. 2.

The outputs of each of the register stages 54a, 54b, 54c, 54d, and 54e are, as shown, coupled to the data (d) and scan data in (sdi) inputs of the next succeeding register stage 54b, ..., 54f, respectively, of the ring counter 54. The bus enable register 50 receives the output of the register stage 54f at its scan data input (sdi), and receives at its data (d) input, as indicated above, the output of the multiplexer 52.

The multiplexer 52 is controlled by a bypass signal to select between a system enable (sys_enable), developed during normal (non-test) operation, and the output of the counter stage 54f. Asserting bypass, in effect, configures the stages 54a, ..., 54f and bus enable register 50 to form the ring counter 54. De-asserting bypass removes the stages 54a, ..., 54f from the any operating capacity in the sub-system.

FIG. 3 also diagrammatically illustrates the remainder of the subsystem 12a in a scan mode configuration, showing the elemental memory stages (exclusive of the bus enable register 50) that make up the subsystem 12a configured in the scan string 60. Although not specifically shown, it should be understood that the elemental memory stages that make up the subsystem 12a, and therefore the scan string 60, are constructed as shown in FIG. 2. The input to the scan string 60 is supplied by multiplexer 62 which is controlled by the bypass test signal to select between scan data (when bypass is asserted) and the output of the bus enable register 50 (when bypass is not asserted, such as when in a normal mode of operation, or when scanning in the initialization data). The selection made by the multiplexer 62 input is coupled to the scan string 60, and the output of scan string 60 forms the scan data out ($sdo_1$) for the subsystem 12a.

The number of stages used for the ring counter 54 (including the bus enable register 50) will be at least equal to, or more than, the number of subsystems 12, i.e., the number of elements sharing the bus 14. The number of stages is preferably selected to remove any correlation between the sequencing of the counter and the states assumed by the linear feedback shift register, contained in the scan control logic 20, to ensure that the two (the counter 54 and linear feedback shift register) will not achieve some form of synchronization in order to make the scan test procedure as random-looking as possible. Thus, the states assumed should be prime to each other. Here, the number of subsystems is preferably less than seven, a prime number. Similarly, the linear feedback shift register (not shown) is designed with 17 stages and, therefore, is capable of assuming $2^{17}$ (i.e., 131,072) states.

Figure 4:
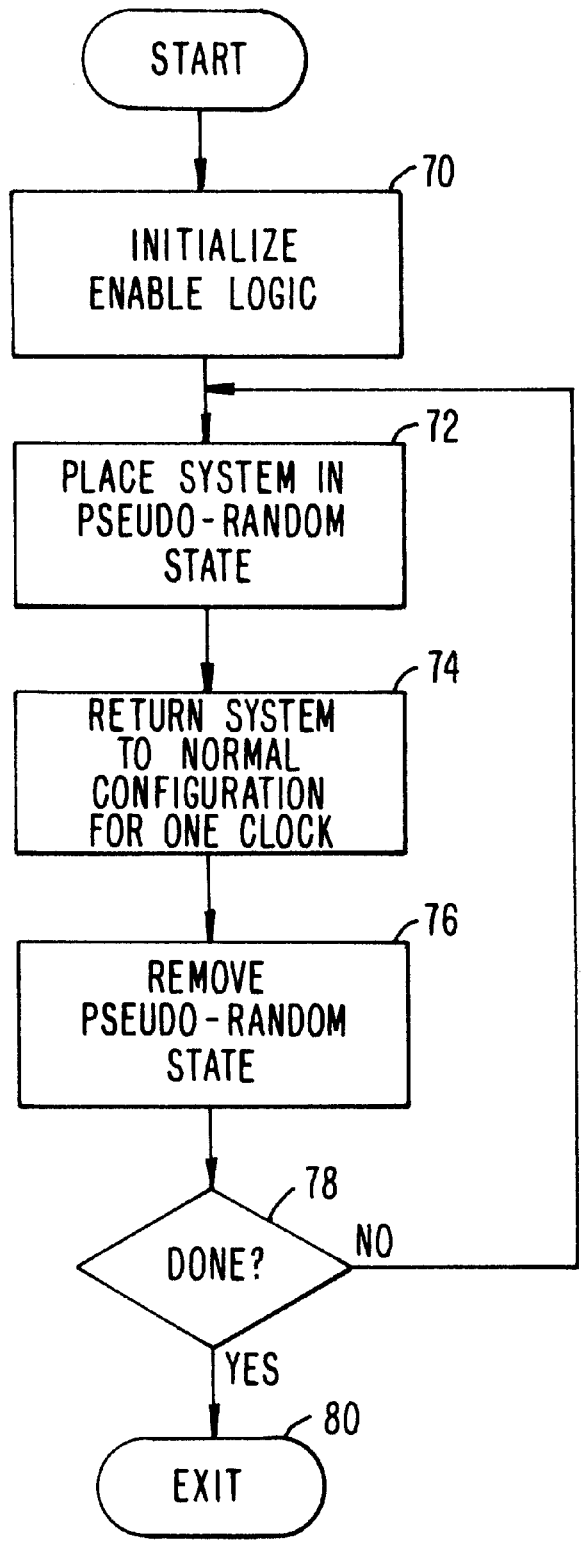
FIG. 4 is a flow diagram that illustrates the scan test procedure used to test the digital system of FIG. 1.

Operation of the scan logic 42 during scan mode is as follows, and may be better understood with reference to FIG. 4 as well as FIGS. 1 and 3. FIG. 4 is a general diagram of the flow sequence used when conducting a scan test. The test begins at step 70 with the scan control logic 20 (FIG. 1) asserting the scan signal (the bypass signal is, for now, left de-asserted) to initially form the ring counter 54. Of course, the assertion of the scan signal will also form the scan strings 60 (FIG. 3) in each of the subsystems 12, but this is not important at this stage of the test—which is to initialize the ring counters 54.

With the subsystems 12, and in particular the ring counters 54 they contain, so configured, step 70 continues with the scan control logic 20 supplying predetermined bit patterns to the scan data inputs ($sdi_1, \ldots, sdi_n$) that are scanned into the ring counters 54. The predetermined bit patterns are such that one of the ring counters 54 (e.g., that in subsystem 12*a*) will be preset so that its bus enable register 50 contains a 1, and the remaining stages contain a 0. The other ring counters 54 (e.g., of subsystems 12*b*, . . . , 12*n*) will have bit patterns that leave the bus enable registers 50 with a 0, and a 1 in one of the remaining stages 54*a*, . . . , 54*f*; that is, the predetermined bit pattern is such that one and only one bus enable register 50 of the subsystems 12 will be enabled at any one time. The enable logic is now initialized for the pseudo-random scan test to follow. During this initialization process, circuitry (not shown) between the bus enable register 50 and the input 48 of the bus driver circuit 40 will operate to hold the bus driver circuit 40 in its tri-state mode. At the conclusion of the initialization, the content bus driver enable register 50 will control the mode to the bus driver circuit 40.

Digressing for the moment, it will be appreciated by those skilled in this art that the predetermined bit pattern may contain more that one "1" so that one or more of the ring counters 54 are present with a pattern with two or more "1s". This allows certain of the bus enable circuits of a subsystem to be exercised more than those of the other subsystems. This feature also allows the test to adapt to different configurations of the system 10. For example, if certain of the subsystems 12 have been removed from the system 10, other of the subsystems may be allowed to take over the bus access cycles that would be normally be allocated, during testing, to the removed subsystem 12. However, it remains that the bus enable register 50 of one and only one subsystem 12 will hold a "1" of the ring counter 54 so that only one subsystem 12 drives the shared bus 14 at any one time.

Step 70 is exited in favor of step 72 with the scan control logic raising the bypass signal, keeping the scan signal asserted. As described above, the combination of scan and bypass will assert hold' to freeze the ring counters 54. Also, as can be seen from FIG. 3, the assertion of the bypass signal operates the multiplexer 62 to select and apply the scan data input ($sdi_1$) to the scan string 60, effectively removing the ring counter 54 (including the bus enable register 50) from the scan chain of their particular subsystem 12.

The scan control logic 20 will remain in step 72, asserting the scan and bypass signals, and applying a pseudo-random patterns to the scan data inputs $sdi_1, \ldots, sdi_n$ for the requisite number of system clocks (CLK) required to place the scan string 60, and thereby the subsystems 12, in a pseudo-random state. Note that since the ring counters 54 are frozen, and only one of them contains a 1 in the associated bus enable register 50, only the corresponding bus drive circuit 40 will be enabled to drive the shared bus 14; all other subsystems 12 will have a 0 contained by their bus enable registers 50 so that the corresponding bus drive circuits are disabled. Only one subsystem 12 will be able to drive the shared bus 14.

Once the subsystems 12 have be placed in pseudo-random states, the test proceeds to step 74 where the scan control logic 20 drops (de-asserts) the scan and hold signals. As is conventional in pseudo-random testing, the subsystems 12 are returned to their normal configurations and allowed to execute one cycle of the system clock (CLK) before being returned to the scan test configuration by the scan control logic 20 with the assertion of the scan and hold test signals.

However, while in step 74 the hold and scan test signals are all de-asserted to allow the subsystems 12 to momentarily returned to their normal configurations to execute one cycle of the system clock, CLK. This being so, the hold' signal applied to the ring counters 54 is also de-asserted so that the ring counters 54 of the subsystems 12 are released from their frozen states. They are then also allowed to operate for the one clock cycle to move the content of each of the stages of the ring counter 54 (i.e. stages 54*a*, . . . , 54*f* and bus enable register 50) to the next stage (via the data (d) inputs since the scan signal is not, at this time, asserted), with the content of the bus enable register 50 moving (recirculating) to the ring counter stage 54*a*. The predetermined bit patterns to which the ring counters were preset during the initialization step 70 are shifted so that the bus driver circuit 40 that was enabled to drive the shared bus 14 during step 72 is replaced with another bus driver circuit.

The step 74 is exited with assertion of the scan and hold signals. The ring counters 54 are returned to a frozen condition and the subsystems 12 reconfigured to form scans strings. The pseudo-random states of the subsystems 12 (i.e., scan strings 60) are removed in step 76 and communicated to the control logic 20 for analysis via the scan data outputs $sdo_1, \ldots, sdo_n$.

Conventional pseudo-random scan testing involves repeating the sequence of steps 72–76 a set number of times (e.g. the number of states capable of being assumed by the 17-stage linear feedback shift register before repeating any one of those states), so that the scan control logic 20 will check, at step 78, to see if the desired number of sequences have been performed. If step 78 concludes that all desired sequences have not been completed, the process will return to the step 72. If, however, the requisite number of sequences have been performed, the process exits at step 80.

During the testing conducted according to FIG. 4, the predetermined pattern placed in the ring counters 54 is rotated one position each sequence during step 74. At all other times of each test sequence the counters 54 (and bus enable registers 50) are held fixed. It will be apparent, therefore, that since during any one test sequence only one of the subsystems 12 is allowed to drive the shared bus 14, and that one changes from sequence to sequence, not only are deterministic test results ensured, but the shared bus 14 and associated drive circuits are included in the test.

In closing, it will be appreciated by those skilled in this art that while the present invention has been described in the context of a scan test architecture that used linear (or serial) scan chains (including the structure of the counters 54), parallel-load scan-test architecture will also find the present invention advantageous for systems that include a shared bus.

What is claimed is:

1. Apparatus for permitting scan testing of a digital system of a type having at least two digital units coupled to a bus means that is shared by the two digital units for communication of information therebetween on a mutually exclusive basis during a normal mode of operation, each one of the two digital units including bus enable means coupling each of the two digital units to the bus means, the scan testing being conducted during a test mode of operation by a scan control means coupled to the digital system for placing the digital system in a pseudo-random state, the apparatus comprising:

circuit means associated with each of the two digital units, and coupled to the scan control means, for receiving a predetermined test pattern;

means coupled to the scan control means and responsive to a test signal from the scan control means to couple the circuit means to the bus enable means to ensure that only one of the bus enable means is coupled to the bus means at any moment in time during the test mode of operation.

2. The apparatus of claim 1, wherein the circuit means includes a counter presetable to the predetermined test pattern.

3. The apparatus of claim 2, wherein the counter is a ring counter.

4. The apparatus of claim 2, wherein the scan testing of the digital system includes placing the digital system in a pseudo-random state in each of a number of cycles, and wherein the counter is caused to change count with each of the number of cycles.

5. The apparatus of claim 4, wherein the counter is incremented each of the number of cycles.

6. The apparatus of claim 5, wherein the counter is incremented by one each of the number of cycles.

7. Apparatus for pseudo-random scan testing a digital system of a type including a plurality of digital units intercoupled by a shared bus means for communicating digital signals therebetween on a mutually exclusive basis, the digital signals being coupled to the shared bus means by circuit means enabled by assertion of an enable signal; the apparatus comprising:

scan control means operating to initiate a test period to produce a number of test signals, including a scan signal;

counter means, associated with circuit means of each of the digital units responsive to at least one of the test signals for producing a test enable signal;

means for presetting the counter means with a predetermined test pattern; and means, responsive to other of the test signals for communicating the test enable signal from each of the counter means to each associated circuit means in place of the enable signal;

whereby the predetermined test pattern used to preset each of the counter means is such that one and only one of the circuit means is enabled to couple the associated digital unit to the shared bus means at any moment in time during the test period.

8. In a digital system of a type having two or more digital subsystems configured to be tested by repeated cycles of having pseudo-random data applied thereto, each of the digital subsystems being coupled to a shared bus by an enable logic unit that permits access to the shared bus for communicating information thereon when a bus enable signal is asserted, a bus enable test logic incorporated in each digital subsystem to ensure that during testing only one or none of the digital subsystems have access to the shared bus, the bus enable test logic comprising:

a digital counter presettable to a predetermined state, and producing a test enable signal;

a selector coupled to receive the bus enable signal and the test enable signal to substitute the test enable signal for the bus enable signal during testing;

such that when the digital system is subjected to testing the digital counter associated with a one of the digital subsystems is set to the predetermined state produce a test enable signal that permits access to the shared bus, and the counter associated with the other of the digital subsystems is set to a state that prohibits, access to the shared bus.

9. The bus enable test logic of claim 8, wherein the digital counter is a ring counter.

10. The bus enable test logic of claim 9, wherein the ring counter includes multiple one-bit stages, and wherein a one of the multiple one-bit stages has a data output that supplies the test enable signal.

11. The bus enable test logic of claim 9, wherein the predetermined state comprises multiple bits having at least one of the multiple bits set to a first digital state, and the other of the multiple bits set to a second digital state.

12. The bus enable test logic of claim 11, wherein the first digital state is a logic ONE.

13. The bus enable test logic of claim 8, wherein the digital counter is caused to change count each of the repeated cycles.

14. The bus enable test logic of claim 8, wherein the digital counter is incremented each of the repeated cycles.

15. A method of performing a scan test of a digital system that includes a plurality of digital subsystems intercoupled by a shared bus for communicating digital signals therebetween, each of the digital subsystems having driver enable circuitry operating to drive the digital signals onto the shared bus in response to an enable signal, the method comprising the steps of:

providing a counter means for each of the digital subsystems for providing a test enable signal that is coupled to the driver enable circuitry of each digital subsystem;

loading the counter means of each digital subsystem with a predetermined state;

setting the digital subsystems to a pseudo-random state while operating the counter means of each digital subsystem so that one and only one of the digital subsystems has access to the shared bus;

removing the pseudo-random state from the digital subsystems for examination;

repeating the setting and removing steps a predetermined number of times; and associated with each repeating step, modifying the counter means so that another one of the digital subsystems is provided exclusive access to the shared bus;

whereby, during the scan test each of the digital subsystems has exclusive access to the shared bus at least once.

16. A method of scan testing of a digital system of a type having a plurality of digital units coupled to a shared bus, each one of the plurality of digital units including a bus enable logic that communicates the digital unit to the shared bus in response to a bus enable signal, the method. comprising the steps of:

provide each of the plurality of digital units with a bus enable test circuit;

presetting the bus enable test circuit of each of the plurality of digital units with a predetermined test pattern to produce a test enable signal that is of a first digital state for a one of the plurality of digital units, and of another digital state for the other of the plurality of digital units;

for each of the plurality of digital units, selecting the test enable signal in place of the bus enable signal when a test signal is asserted;

applying pseudo-random data to the plurality of digital units in repeated cycles; and changing the predetermined test pattern for each one of the plurality of digital units each of the repeated cycles so that test enable signal ensures that none or one and only one of the plurality of digital units is communicated to the shared bus at any moment in time.

17. The method of claim 16, wherein the bus enable test circuit includes a digital counter.

18. The method of claim 17, wherein the presetting step includes presetting the digital counter with a count.

19. The method of claim 18, wherein the changing step includes the step of changing the count.

20. The method of claim 18, wherein the changing step includes the step of incrementing the count.

* * * * *